United States Patent
Lin

(10) Patent No.: US 7,102,619 B2
(45) Date of Patent: Sep. 5, 2006

(54) UNIVERSAL SERIAL BUS KEYBOARD CONTROL CIRCUITRY

(75) Inventor: I-Ming Lin, Taipei (TW)

(73) Assignee: VIA Technologies, Inc., Taipei (TW)

(\*) Notice: Subject to any disclaimer, the term of this patent is extended or adjusted under 35 U.S.C. 154(b) by 502 days.

(21) Appl. No.: 10/675,942

(22) Filed: Oct. 2, 2003

(65) Prior Publication Data

US 2004/0080437 A1    Apr. 29, 2004

(30) Foreign Application Priority Data

Oct. 25, 2002   (TW) ............................... 91125205 A

(51) Int. Cl.
*G09G 5/00* (2006.01)
*H03K 17/94* (2006.01)

(52) U.S. Cl. ......................... 345/168; 341/22

(58) Field of Classification Search ........ 345/168–172; 341/22–34

See application file for complete search history.

(56) References Cited

U.S. PATENT DOCUMENTS

| | | | |
|---|---|---|---|
| 6,630,895 B1* | 10/2003 | Dong | 341/22 |
| 6,859,150 B1* | 2/2005 | Kuo et al. | 341/26 |
| 6,903,727 B1* | 6/2005 | Mambakkam et al. | 345/168 |

\* cited by examiner

*Primary Examiner*—Dennis-Doon Chow
(74) *Attorney, Agent, or Firm*—Rabin & Berdo, P.C.

(57) ABSTRACT

A keyboard control apparatus with a USB interface for use in a notebook computer having a number of keys. In one embodiment, a mapping unit is employed to store a number of key matrix codes corresponding to the keys. In accordance with a clock signal and a start signal, a shift register is capable of generating a reference signal and a number of scan output signals. A key matrix circuit then receives the scan output signals to provide a number of scan input signals. An address generator is used to generate an address signal based on the reference signal and a triggered scan input signal. Thus, a selector can select one key matrix code designated to the address signal from the mapping unit. Additionally, an interface converter further converts the selected key matrix code into a pair of differential signals compliant with the USB specification.

10 Claims, 2 Drawing Sheets

UNIVERSAL SERIAL BUS KEYBOARD CONTROL CIRCUITRY

BACKGROUND OF THE INVENTION

1. Field of the Invention

The invention relates to integrated circuits, and more particularly to universal serial bus (USB) keyboard control circuitry for use in a notebook computer.

2. Description of the Related Art

Users of personal computers have been liberated from the restrictions of desktop-only use with the introduction of portable "notebook" computers. In recent years, the notebook computer has made considerable gains in both popularity and sophistication. The convenience and transportability of the notebook computer has produced a large and lucrative market for manufacturers of such machines. In general, keyboards are the primary user interface for entering information and commands into a computer. The keyboard used with a desktop computer typically contains a keyboard controller which responds to the depression of a key on the keyboard by generating a key matrix code corresponding to the depressed key, and by supplying the code in a digital form to a host or the like.

The keyboard used in a notebook computer, on the other hand, does not include the above keyboard controller. Conventionally, a special embedded controller in the notebook computer takes charge of the keyboard control function. The embedded controller is a powerful microcontroller which assumes many jobs in a notebook computer, such as power management, screen brightness adjustment, keyboard control, and so forth. However, the embedded controller is more expensive than an ordinary logic circuit and must work with the basic input/output system (BIOS). Furthermore, manufacturers must pay a royalty to obtain the rights to make and sell notebook computers using the keyboard BIOS. In addition to the royalty expense, the manufacturer is required to design a program cooperating with the licensed keyboard BIOS to enable the embedded controller to carry out the keyboard control function. Unfortunately, this program must be rewritten for use in other keyboard models when the key arrangement is changed. Therefore, a simple and inexpensive scheme for keyboard control in a notebook computer, unencumbered by the existing limitations, is called for.

SUMMARY OF THE INVENTION

To fulfill requirements for design flexibility, the conventional method can be replaced by a simple logic circuit and a small size non-volatile memory without incurring royalty expense in accordance with the invention. Moreover the use of the USB interface allows the present invention to easily connect various core logic chipsets from different providers. Due to the low signal count, the USB interface also maximizes hardware efficiency and circuit simplicity.

Accordingly, the present invention provides a keyboard control apparatus having a USB interface for use in a notebook computer.

The apparatus of the invention is composed of a mapping unit, a shift register, a key matrix circuit, an address generator, a selector and an interface converter. The mapping unit stores a plurality of key matrix codes corresponding to the keys of the notebook computer. In accordance with a clock signal and a start signal, the shift register can generate a reference signal and a plurality of scan output signals. The key matrix circuit is coupled to the shift register to receive the scan output signals and outputs a plurality of scan input signals. Note that all the keys of the notebook computer can be rendered by means of the scan output signals together with the scan input signals. Therefore, the key matrix circuit triggers one of the scan input signals when a corresponding key is actuated. The address generator is separately coupled to the shift register and the key matrix circuit to receive the reference signal and the scan input signals, so that an address signal is generated in accordance with the reference signal and the triggered scan input signal. The selector is coupled to the address generator and the mapping unit, separately. The selector receives the address signal from the address generator and selects one key matrix code designated to this address signal from the mapping unit. Furthermore, the interface converter is coupled to the selector and converts the selected key matrix code into a pair of differential signals compliant with the USB specification.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
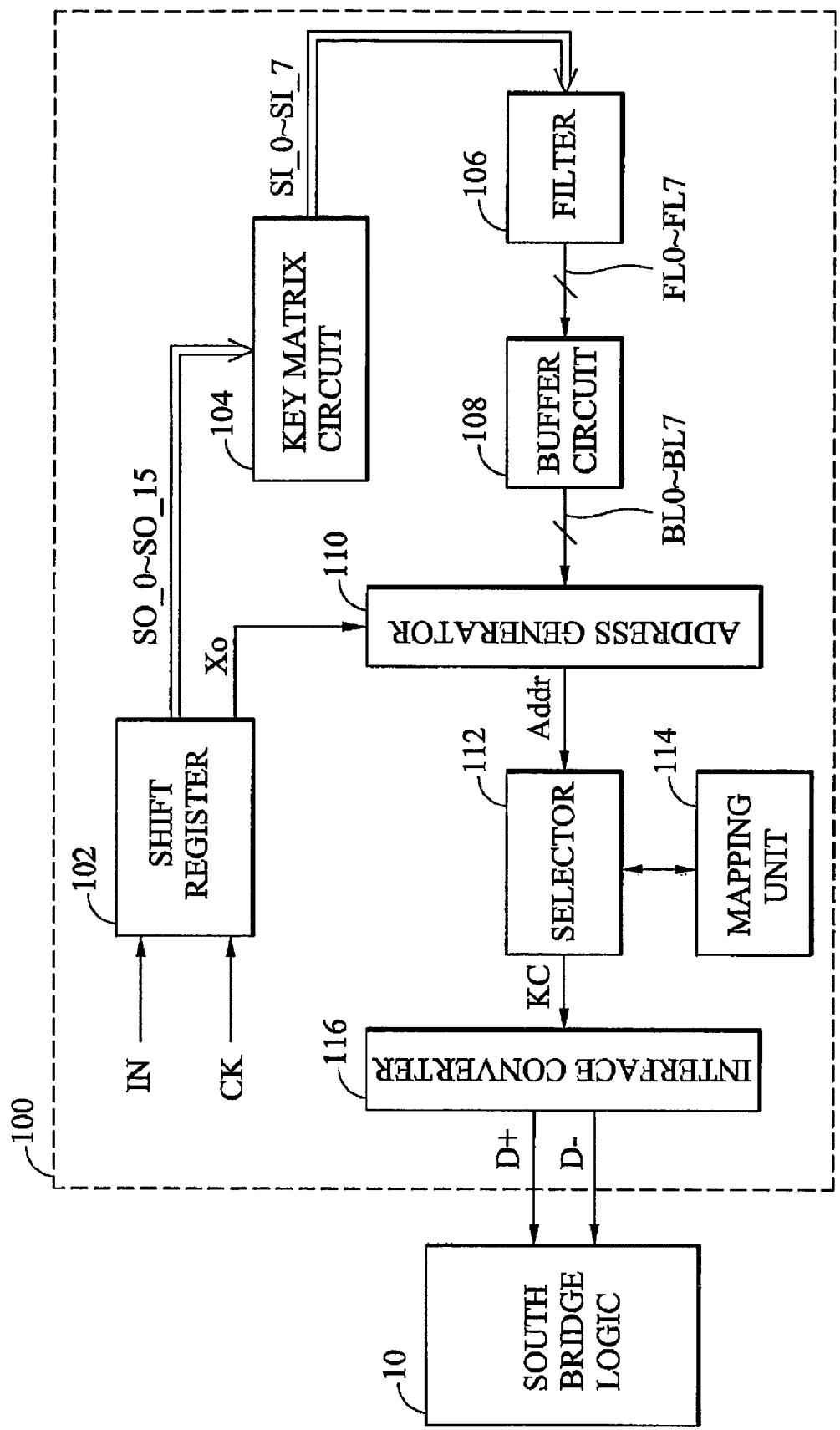
FIG. 1 is a block diagram of a preferred embodiment in accordance with the invention.
Figure 2:
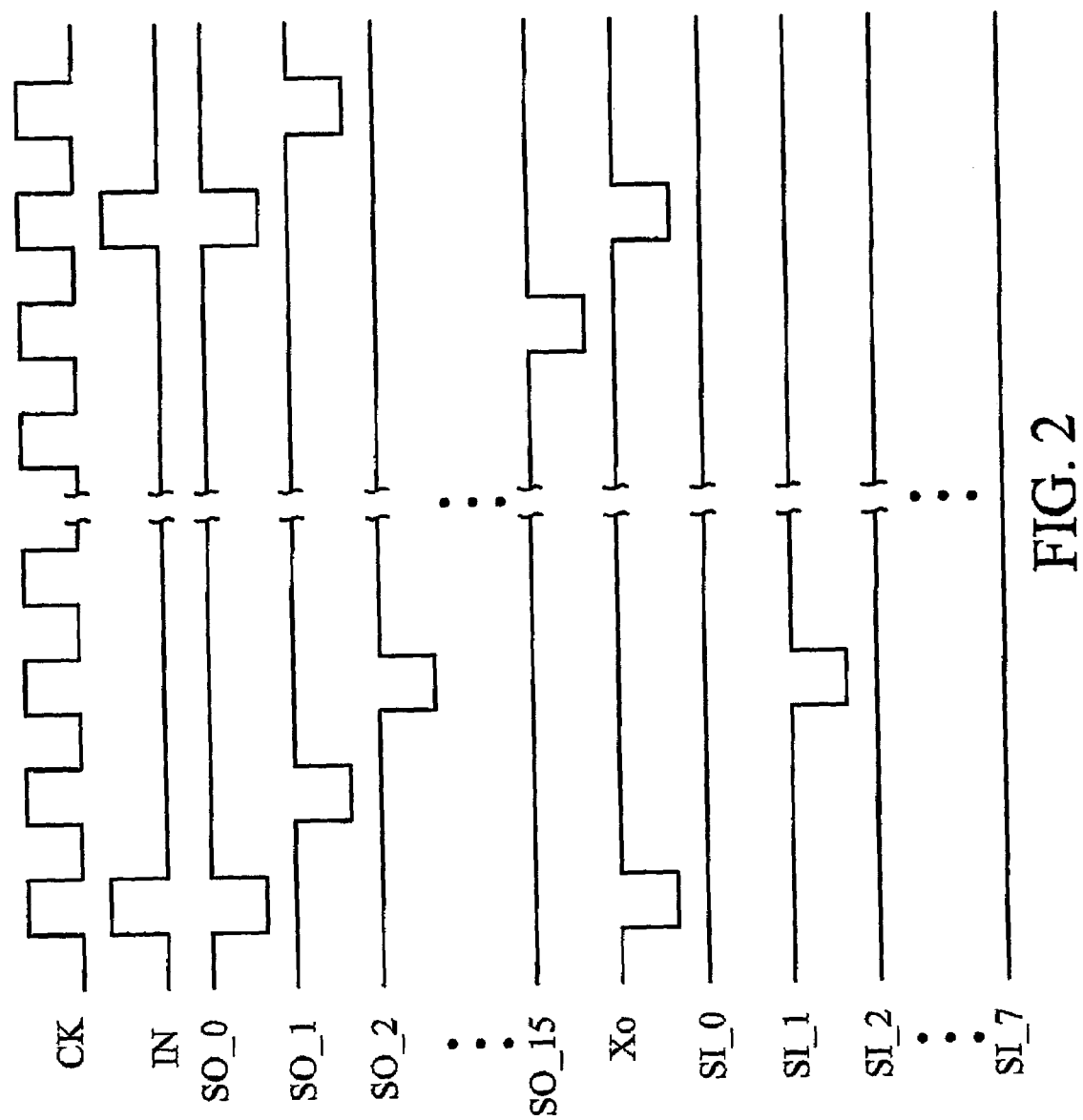
FIG. 2 is an exemplary timing diagram of signal waveforms in accordance with the invention.

Referring to FIG. 1, a keyboard control apparatus 100 with a USB interface for use in a notebook computer having a plurality of keys is illustrated. The keyboard control apparatus 100 comprises a shift register 102, a key matrix circuit 104, a filter 106, a buffer circuit 108, an address generator 110, a selector 112, a mapping unit 114, and an interface converter 116. For purposes of illustration, the key matrix circuit 104 supports 128 keys arranged in 16 columns by 8 rows (16×8 key matrix). In accordance with a clock signal CK and a start signal IN, the shift register 102 can generate a reference signal Xo and M number of scan output signals SO_0~SO_15, where M=16. Referring to FIG. 2, the shift register 102 receives one asserted IN signal every sixteen cycles of the CK signal. Upon receipt of the asserted IN signal, the SO_0 signal is triggered to generate a negative-going pulse. In the meantime, the Xo signal is asserted as well. At the next CK signal cycle, the SO_1 signal is triggered to generate a negative-going pulse. In similar fashion, the remaining scan output signals are triggered in turn. After the SO_15 signal is triggered, the asserted IN signal is received again at the next CK signal cycle. Therefore, the SO_0 signal is triggered and the Xo signal is asserted again. As such, the SO_0 through SO_15 signals are triggered sequentially between assertions of the IN signal, in which the trigger phase relationships between these scan output signals are different from signal to signal. The shift register 102 performs the above operations periodically.

Turning back to FIG. 1, the key matrix circuit 104 is coupled to the shift register 102 to receive the SO_0 through SO_15 signals and outputs N number of scan input signals SI_0~SI_7, where N=8. Due to the 16×8 key matrix as illustrated earlier, the key matrix circuit 104 is constituted by sixteen column lines and eight row lines. Note that all the keys of the notebook computer can be rendered by means of the scan output signals together with the scan input signals. The key matrix circuit 104 receives the SO_0 through SO_15 signals at the respective column lines and provides the SI_0 through SI_7 signals at the respective row lines. Note that intersections of the row and the column lines are arranged corresponding to the keys of the notebook computer. When a corresponding key is actuated, one of the intersections is activated to trigger a related scan input signal. For instance, the key matrix circuit 104 activates the intersection formed by the 2nd row line and the 3rd column line when a key at row 2, column 3 in the keyboard is depressed. Because the SO_0 through SO_15 signals received at the respective column lines are triggered sequentially, periodically and rapidly as shown in FIG. 2, the 2nd row line is triggered and a negative-going pulse is generated at the SI_1 signal accordingly.

Bouncing noises may occur on the SI_0 through SI_7 signals when a key is depressed or released. The keyboard control apparatus 100 preferably includes the filter 106, which is coupled to the key matrix circuit 104, to filter the noise from the scan input signals. With the filter 106, the SI_0 through SI_7 signals are filtered and respective filtered versions of the SI_0 through SI_7 signals are fed to the buffer circuit 108 via lines FL0 through FL7. The buffer circuit 108 is coupled between the filter 106 and the address generator 110. The respective filtered versions of the SI_0 through SI_7 signals are amplified at the buffer circuit 108 and respective amplified versions of the SI_0 through SI_7 signals are provided to the address generator 110 via lines BL0 through BL7 accordingly. The address generator 110 is also coupled to the shift register 102 to receive the Xo signal. The mapping unit 114 is employed to store a plurality of key matrix codes corresponding to the keys of the notebook computer. Because the key arrangement is different from model to model and from manufacturer to manufacturer, there are a variety of possible key definitions corresponding to the intersections in the key matrix circuit 104. For various notebook computers, the content of the mapping unit 114 must be varied with the relationship between the key matrix codes and the intersections in the key matrix circuit 104. The mapping unit 114 is representative of a non-volatile memory, for example, but not limited to, Electrically Erasable Programmable Read-Only Memory (EEPROM). The key matrix codes corresponding to the exact intersections in the key matrix circuit 104 are programmed and stored into the mapping unit 114 in accordance with the key arrangement designated by the individual manufacturer. The use of the mapping unit 114 allows the keyboard control apparatus 100 to be easily adapted to a wide variety of notebook computers.

On the basis of the Xo signal and the triggered scan input signal, the address generator 110 can generate an address signal Addr. As the example stated earlier, the SI_1 signal received at the 2nd row line is triggered when the key at row 2, column 3 is depressed. Therefore, the address generator 110 detects the key being actuated is located at row 2 in the keyboard. Due to the number of the CK signal's cycles between the Xo signal and the triggered SI_1 signal, as shown in FIG. 2, the address generator 110 also knows the key being actuated is located at column 3 in the keyboard. Then, the Addr signal indicative of the corresponding intersection in the key matrix circuit 104 is thus generated. The selector 112 is coupled to the address generator 110 and the mapping unit 114, separately; it receives the Addr signal from the address generator 110 and selects one key matrix code designated to the Addr signal from the mapping unit 114. Typically, each key of a notebook computer represents one or more key functions, so special function keys are used to switch among the key functions allocated to a particular key. In other words, the exact key matrix code, which is output upon the depression of a key, is changed depending on the states of special function keys, such as the Shift key, the Ctrl key, the Alt key, the Fn key, the Num Lock key, and also depending on the state of the Caps Lock key. For instance, the keyboard control apparatus 100 normally generates a key matrix code indicative of the small form of letter "a" when the key "A" is depressed. However, a key matrix code indicative of a capital "A" is output if the Caps Lock key has been actuated. As such, the Caps Lock key is used to toggle between the two typefaces. The selector 112 includes a number of storage elements to store status data representing the states of special function keys so that one of the key matrix codes is selected from the mapping unit 114 in accordance with the Addr signal and the status data.

Furthermore, the interface converter 116 is coupled to the selector 112 and converts the selected key matrix code KC, namely the output of the selector 112, into a pair of differential D+ and D− signals compliant with the USB specification. In this manner, the selected key matrix code KC can be transmitted in the form of the D+ and D− signals to south bridge logic 10 of a notebook computer for further processing. It should be appreciated to those skilled in the art that the keyboard control apparatus 100 is contemplated to be not only an independent circuit but also an integration design which incorporates the apparatus 100 in the south bridge logic for example.

In view of the above, the present invention discloses a keyboard control apparatus with USB interface for use in a notebook computer. The apparatus of the invention is embodied with a simple logic circuit and a small amount of non-volatile memory. Instead of the expensive embedded controller, keyboard control and design flexibility can be accomplished without incurring royalty expense. Furthermore, the USB interface allows the apparatus of the invention to easily connect various core logic chipsets from different providers. The use of the USB interface also maximizes hardware efficiency and circuit simplicity due to the low signal count.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A keyboard control apparatus with a universal serial bus (USB) interface for use in a notebook computer having a plurality of keys, comprising:

a mapping unit for storing a plurality of key matrix codes corresponding to said plurality of keys;

a shift register for generating a reference signal and a plurality of scan output signals in accordance with a clock signal and a start signal;

a key matrix circuit coupled to said shift register to receive said plurality of scan output signals, for outputting a plurality of scan input signals and triggering one of said plurality of scan input signals when a corresponding key of said notebook computer is actuated, in which said plurality of keys are rendered by means of said plurality of scan output signals together with said plurality of scan input signals;

an address generator coupled to said shift register to receive said reference signal and coupled to said key matrix circuit to receive said plurality of scan input signals, for generating an address signal in accordance with said reference signal and said triggered scan input signal;

a selector separately coupled to said address generator and said mapping unit, for receiving said address signal and selecting one of said plurality of key matrix codes which is designated to said address signal; and an interface converter coupled to said selector, for converting said selected key matrix code into a pair of differential signals compliant with the universal serial bus (USB) specification.

2. The keyboard control apparatus of claim 1 wherein said selector comprises a plurality of storage elements for storing status data so that one of said key matrix codes is selected from said mapping unit in accordance with said address signal and said status data.

3. The keyboard control apparatus of claim 1 further comprising a filter coupled to said key matrix circuit, for filtering noise from said scan input signals and providing respective filtered versions of said scan input signals to said address generator.

4. The keyboard control apparatus of claim 3 further comprising a buffer circuit coupled between said filter and said address generator, for amplifying said respective filtered versions of said scan input signals and providing respective amplified versions of said scan input signals to said address generator.

5. The keyboard control apparatus of claim 1 wherein said shift register sequentially triggers said scan output signals between assertions of said start signal, in which trigger phase relationships between said scan output signals are different.

6. The keyboard control apparatus of claim 1 wherein said key matrix circuit comprises a plurality of row lines to provide said scan input signals, respectively, and a plurality of column lines to receive said scan output signals, respectively, in which intersections of said row lines and said column lines are arranged corresponding to said keys of said notebook computer.

7. The keyboard control apparatus of claim 6 wherein one of said intersections is activated to trigger a related scan input signal when said corresponding key of said notebook computer is actuated.

8. The keyboard control apparatus of claim 1 wherein said mapping unit is formed of a non-volatile memory.

9. The keyboard control apparatus of claim 1 wherein said mapping unit is formed of an Electrically Erasable Programmable Read-Only Memory (EEPROM).

10. The keyboard control apparatus of claim 1 wherein said interface converter transmits said selected key matrix code in the form of said pair of differential USB signals to south bridge logic of said notebook computer for further processing.

* * * * *